United States Patent
Adkisson et al.

(10) Patent No.: US 7,446,007 B2
(45) Date of Patent: Nov. 4, 2008

(54) MULTI-LAYER SPACER WITH INHIBITED RECESS/UNDERCUT AND METHOD FOR FABRICATION THEREOF

(75) Inventors: James W. Adkisson, Jericho, VT (US);
Marc W. Cantell, Sheldon, VT (US);
James R. Elliott, Huntington, VT (US);
James V. Hart, III, Barre, VT (US);
Dale W. Martin, Hyde Park, VT (US)

(73) Assignee: International Business Machines Corporation, Armonk, NY (US)

( * ) Notice: Subject to any disclaimer, the term of this patent is extended or adjusted under 35 U.S.C. 154(b) by 20 days.

(21) Appl. No.: 11/560,893

(22) Filed: Nov. 17, 2006

(65) Prior Publication Data

US 2008/0116493 A1    May 22, 2008

(51) Int. Cl.
*H01L 21/336* (2006.01)
(52) U.S. Cl. ............... 438/303; 438/595; 257/E21.626
(58) Field of Classification Search .......... 438/303, 438/595; 257/E21.626
See application file for complete search history.

(56) References Cited

U.S. PATENT DOCUMENTS

| | | | |
|---|---|---|---|
| 5,760,451 A * | 6/1998 | Yu ........................ | 257/382 |
| 5,783,479 A * | 7/1998 | Lin et al. .................. | 438/592 |
| 6,512,266 B1 * | 1/2003 | Deshpande et al. ......... | 257/333 |
| 6,541,351 B1 | 4/2003 | Bartlau et al. | |
| 2005/0003589 A1 | 1/2005 | Doris et al. | |
| 2005/0116289 A1 | 6/2005 | Boyd et al. | |
| 2005/0118826 A1 | 6/2005 | Boyd et al. | |
| 2005/0184360 A1 * | 8/2005 | Ho et al. ..................... | 257/565 |
| 2005/0287823 A1 * | 12/2005 | Ramachandran et al. .... | 438/791 |
| 2006/0001095 A1 | 1/2006 | Doris et al. | |
| 2006/0017066 A1 | 1/2006 | Geiss et al. | |

* cited by examiner

*Primary Examiner*—Trung Dang
(74) *Attorney, Agent, or Firm*—Scully, Scott, Murphy & Presser, P.C.; William D. Sabo, Esq.

(57) ABSTRACT

A semiconductor structure includes a multi-layer spacer located adjacent and adjoining a sidewall of a topographic feature within the semiconductor structure. The multi-layer spacer includes a first spacer sub-layer comprising a deposited silicon oxide material laminated to a second spacer sub-layer comprising a material that is other than the deposited silicon oxide material. The first spacer sub-layer is recessed with respect to the second spacer sub-layer by a recess distance of no greater than a thickness of the first spacer sub-layer (and preferably from about 50 to about 150 angstroms). Such a recess distance is realized through use of a chemical oxide removal (COR) etchant that is self limiting for the deposited silicon oxide material with respect to a thermally grown silicon oxide material. Dimensional integrity and delamination avoidance is thus assured for the multi-layer spacer layer.

13 Claims, 3 Drawing Sheets

US 7,446,007 B2

MULTI-LAYER SPACER WITH INHIBITED RECESS/UNDERCUT AND METHOD FOR FABRICATION THEREOF

BACKGROUND

1. Field of the Invention

The invention relates generally to semiconductor structures. More particularly, the invention relates to enhanced structural integrity of multilayer spacers fabricated within semiconductor structures.

2. Description of the Related Art

In addition to active semiconductor devices and passive semiconductor devices such as resistors, transistors, diodes and capacitors, semiconductor structures often include dielectric structures and conductor structures. The dielectric structures and conductor structures typically serve a purpose of defining and providing a signal propagation pathway for connection and interconnection of the active semiconductor devices and the passive semiconductor devices.

A fairly common structure that is used as an adjunct with other semiconductor structures is a spacer. Spacers may be formed of conductor materials, semiconductor materials and dielectric materials. Spacers may also be formed as laminates or composites of the foregoing materials. Spacers are typically formed using a blanket spacer material layer deposition and a subsequent anisotropic etchback method. Using the foregoing method, a spacer is formed with a characteristic inward pointing tip with respect to a topographic feature that the spacer adjoins over a substrate.

Dielectric spacers in particular provide value within the context of isolating topographic conductor structures within semiconductor structures. The topographic conductor structures may include, but are not limited to interconnect conductor layers, as well as gate electrode conductor layers.

Spacers are clearly an important component within semiconductor structures. However, spacers are not always readily fabricated with optimal properties within semiconductor structures. In particular, optimal spacer profiles are often difficult to achieve within semiconductor structures.

Various semiconductor structures having desirable properties, and methods for fabrication thereof, are known in the semiconductor fabrication art.

For example, Bartlau et al., in U.S. Pat. No. 6,541,351, teaches a method for fabricating an isolation region within a semiconductor substrate with inhibited divot formation at a junction of the isolation region with the semiconductor substrate. To realize the foregoing result, a particular embodiment of the disclosed invention uses a chemical oxide removal (COR) etchant that selectively etches a thermal oxide material formed upon the semiconductor substrate with respect to a deposited oxide material that comprises the adjoining isolation region.

In addition, Doris et al., in U.S. Pub. No. 2005/0003589, teaches an ultra-thin channel semiconductor device within a semiconductor-on-insulator substrate absent a polysilicon stringer beneath the ultra-thin channel semiconductor device. To realize the foregoing result, the disclosed invention uses a chemical oxide removal (COR) etchant for selectively removing a thermal silicon oxide pad oxide layer absent lateral etching of a buried dielectric layer, to thus avoid an undercut of the buried dielectric layer beneath the surface semiconductor layer within the semiconductor structure.

Further, Boyd et al., in U.S. Pub. No. 2005/0116289, teaches an ultra-thin channel field effect transistor structure within a semiconductor-on-insulator (SOI) substrate, and a method for fabricating the same. To realize the foregoing result, the method uses a self-aligned oxygen ion implant method for fabricating the ultra-thin channel, optionally in conjunction with a chemical oxide removal (COR) etchant for removing a pad oxide layer absent damage to the ultra-thin channel.

Finally, Doris et al., in U.S. Pub. No. 2006/0001095, teaches a method for fabricating a fully depleted semiconductor-on-insulator (SOI) field effect transistor where electrical property drift, such as threshold voltage drift, is minimized. To realize the foregoing result, the disclosed invention uses a chemical oxide removal (COR) etchant for recessing a channel within the field effect transistor.

Additional uses for chemical oxide removal (COR) etchants are also taught within: (1) Boyd et al., in U.S. Pub. No. 2005/0118826 (a chemical oxide removal (COR) pre-clean surface preparation used when fabricating an ultra-thin silicon metal oxide semiconductor field effect transistor device); and (2) Geiss et al., in U.S. Pub. No. 2006/0017066 (a chemical oxide removal (COR) etchant used when fabricating a bipolar complementary metal oxide semiconductor (BiCMOS) structure).

Semiconductor structure and device dimensions are certain to continue to decrease. As a result thereof, desirable are spacers that may be fabricated with enhanced performance and enhanced properties, particularly with respect to spacer profile.

SUMMARY

The invention provides a semiconductor structure including a multilayer spacer, and a method for fabricating the semiconductor structure including the multilayer spacer. The multilayer spacer comprises: (1) a first spacer sub-layer comprising a deposited (i.e., not thermally grown) silicon oxide material (and typically located closer to a sidewall of a topographic feature); and (2) a second spacer sub-layer comprising a material that is other than the deposited silicon oxide material (i.e., a material that is other than the material from which is comprised the first spacer sub-layer) located adjoining the first spacer sub-layer (and typically located further from the sidewall of the topographic feature). The first spacer sub-layer is also recessed with respect to the second spacer sub-layer as little as possible, by a distance no greater than about 150 angstroms. The method for fabricating the semiconductor structure includes use of a chemical oxide removal (COR) etchant for etching the first spacer sub-layer with respect to the second spacer sub-layer, while minimizing the recess of the first spacer sub-layer. When using the chemical oxide removal (COR) process with its self-limiting properties as described below, the recess is typically reduced to no more than a thickness of the first spacer sub-layer, independent of how long a chemical oxide removal (COR) etch process proceeds.

A semiconductor structure in accordance with the invention includes a topographic feature located over a substrate. The semiconductor structure also includes a multilayer spacer located adjoining a sidewall of the topographic feature. The multilayer spacer includes a first spacer sub-layer comprising a deposited silicon oxide material laminated to a second spacer sub-layer comprising a material that is other than the deposited silicon oxide material. Within the semiconductor structure, the first spacer sub-layer is recessed with respect to the second spacer sub-layer.

A method in accordance with the invention includes forming a topographic feature over a substrate. The method also includes forming a multilayer spacer adjoining a sidewall of the topographic feature. The multilayer spacer includes a first spacer sub-layer comprising a deposited silicon oxide material laminated to a second spacer sub-layer comprising a material that is other than the deposited silicon oxide material. The method further includes treating the multilayer spacer with a chemical oxide removal (COR) etchant to etch the first spacer sub-layer with respect to the second spacer sub-layer.

Another method in accordance with the invention includes forming a gate electrode over a semiconductor substrate. This other method also includes forming a multilayer spacer adjoining a sidewall of the gate electrode. The multilayer spacer includes a first spacer sub-layer comprising a deposited silicon oxide material laminated to a second spacer sub-layer comprising a material that is other than the deposited silicon oxide material. Finally, this other method includes treating the semiconductor substrate and the multilayer spacer with a chemical oxide removal (COR) etchant to etch the first spacer sub-layer with respect to the second spacer sub-layer.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, that form a material part of this disclosure, wherein.

DESCRIPTION OF THE PREFERRED EMBODIMENT

The invention, which includes a semiconductor structure including a multilayer spacer, as well as methods for fabricating the semiconductor structure including the multilayer spacer, is understood within the context of the description provided below. The description provided below is understood within the context of the drawings provided above. Since the drawings are intended for illustrative purposes, the drawings are not necessarily drawn to scale.

Figure 1:
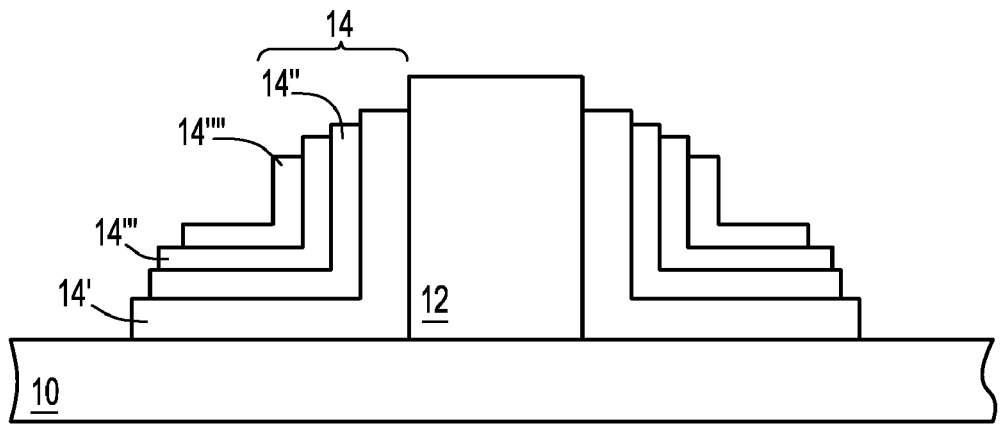
FIG. 1 and FIG. 2 show a pair of schematic cross-sectional diagrams illustrating the results of etching, while using an etch method not in accordance with the invention, a multilayer spacer adjoining a topographic feature within a semiconductor structure.
Figure 2:
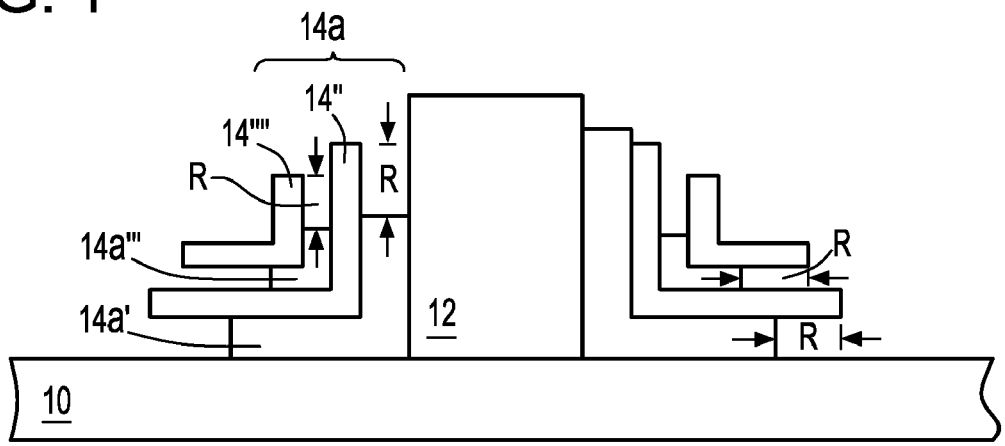

FIG. 1 and FIG. 2 show a pair of schematic cross-sectional diagrams illustrating the results of progressive stages in etching a multilayer spacer adjoining a topographic feature over a substrate, to provide an etched multilayer spacer not in accordance with the invention.

FIG. 1 shows a substrate 10. A topographic feature 12 is located over the substrate 10. A multilayer spacer 14 is located adjacent and adjoining a sidewall (i.e., including opposite sidewalls) of the topographic feature 12. Although the multilayer spacer 14 is illustrated within the context of plural layers within the above cross-sectional diagram, as is understood by a person skilled in the art the multilayer spacer 14 is intended to encircle the topographic feature 12 when viewed in plan-view.

Within the context of a general embodiment in accordance with the invention, the substrate 10 may comprise a material selected from the group including but not limited to conductor materials, semiconductor materials and dielectric materials.

The substrate 10 may also comprise laminates of the foregoing materials and composites of the foregoing materials.

Within the context of a general embodiment in accordance with the invention, the topographic feature 12 may also independently comprise a material selected from the group including but not limited to conductor materials, semiconductor materials and dielectric materials. The topographic feature 12 may also comprise laminates of the foregoing materials and composites of the foregoing materials.

Within the general embodiment and also within a specific inventive embodiment that follows, the multilayer spacer 14 comprises individual spacer sub-layers 14', 14'', 14''' and 14'''' that are successively nested, with the spacer sub-layer 14' adjacent and adjoining the topographic feature 12. Within FIG. 1, the spacer sub-layers 14' and 14''' are intended to comprise a silicon oxide material that is deposited rather than thermally grown. Within the embodiment and the invention, the spacer sub-layers 14'' and 14'''' are intended to comprise a material that is other than the silicon oxide material that comprises the spacer sub-layers 14' and 14'''. This other material from which is comprised the spacer sub-layers 14'' and 14'''' may comprise a material selected from the group including but not limited to conductor materials, semiconductor materials and dielectric materials. Typically, the spacer sub-layers 14'' and 14'''' comprise a dielectric material, and more particularly a silicon nitride dielectric material.

Typically: (1) the spacer sub-layer 14' has a thickness from about 50 to about 150 angstroms; (2) the spacer sub-layer 14'' has a thickness from about 50 to about 150 angstroms; (3) the spacer sub-layer 14''' has a thickness from about 50 to about 150 angstroms; and (4) the spacer sub-layers 14'''' has a thickness from about 200 to about 1000 angstroms.

FIG. 2 shows the results of etching the semiconductor structure of FIG. 1 in a traditional dilute aqueous hydrofluoric acid etchant. Typically, the traditional dilute aqueous hydrofluoric acid etchant comprises a 49 percent aqueous HF:deionized water volume ratio from about 5:1 to about 200:1. As is illustrated within the schematic cross-sectional diagram of FIG. 2, the multi-layer spacer 14 that includes the silicon oxide spacer sub-layers 14' and 14''' is etched to provide a multilayer spacer 14a that includes a corresponding pair of silicon oxide spacer sub-layers 14a' and 14a'''. The silicon oxide spacer sub-layers 14a' and 14a''' have a vertical recess R and a horizontal recess R beneath the spacer sub-layers 14'' and 14''''.

The foregoing dilute hydrofluoric acid etchant is typically used for removing any native silicon oxide or thermal silicon oxide from silicon containing structures within the semiconductor structure of FIG. 1. As such, the foregoing dilute hydrofluoric acid etchant is typically intended to remove about 3 nm to about 12 nm of a thermal silicon oxide material. Since the deposited silicon oxide material that comprises the silicon oxide spacer sub-layers 14' and 14''' is less dense than a thermal silicon oxide material, the recess R has a vertical distance or a horizontal distance from about 200 to about 1000 angstroms when the foregoing dilute hydrofluoric acid etchant removes about 120 angstroms of a thermal silicon oxide material. Such a recess R having the foregoing vertical recess R distance or horizontal recess R distance, or both, may provide sufficient undercutting that delamination of the spacer sub-layers 14'' or 14'''' occurs.

Thus, the invention is directed towards fabricating a semiconductor structure generally in accordance with the semiconductor structure of FIG. 2, but absent the substantial recess R of the spacer sub-layers 14a' and 14a''' that comprise a deposited silicon oxide material with respect to the spacer sub-layers 14'' and 14'''' that comprise a material that is other than the deposited silicon oxide material (i.e., typically a silicon nitride material). To that end, FIG. 3 to FIG. 7 show a series of schematic cross-sectional diagrams illustrating the results of progressive stages in fabricating a semiconductor structure in accordance with particular embodiment of the invention. This particular embodiment of the invention comprises a preferred embodiment of the invention.

Figure 3:
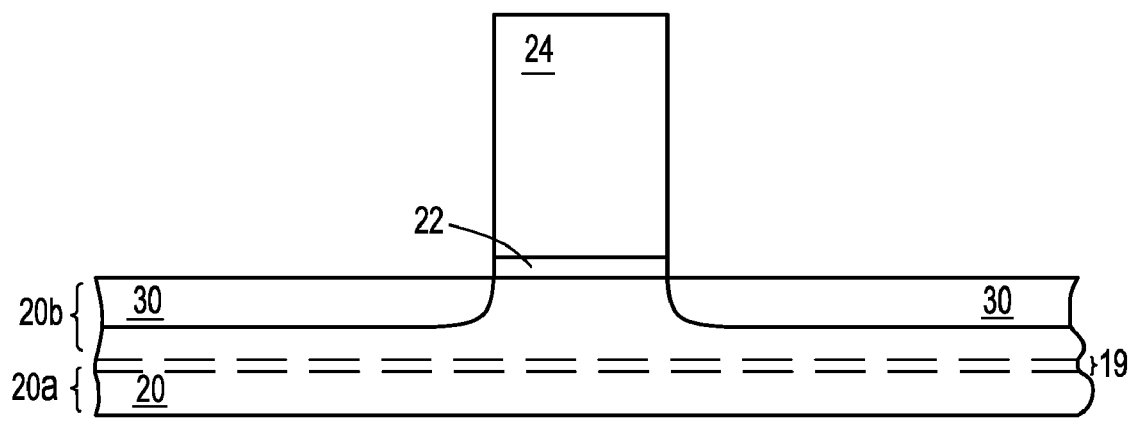
FIG. 3 to FIG. 7 show a series of schematic cross-sectional diagrams illustrating the results of progressive stages in fabricating a field effect transistor including a spacer fabricated in accordance with an embodiment of the invention.

FIG. 3 shows a semiconductor substrate 20. A gate dielectric 22 is located upon the semiconductor substrate 20. A gate electrode 24 is located upon the gate dielectric 22. A pair of extension regions 30 is located within the semiconductor substrate 20 and separated by the gate electrode 24.

The semiconductor substrate 20 may comprise any of several semiconductor materials. Non-limiting examples include silicon, germanium, silicon-germanium alloy, silicon carbide, silicon-germanium carbide alloy and compound (i.e., III-V and II-VI) semiconductor materials. Non-limiting examples of compound semiconductor materials include gallium arsenide, indium arsenide and indium phosphide semiconductor materials. Typically, the semiconductor substrate 20 comprises at least in part a silicon containing semiconductor material that has a thickness from about 0.5 to about 1.5 mm.

Although this particular embodiment illustrates the invention within the context of a semiconductor substrate 20 that is intended as a bulk semiconductor substrate, neither the instant embodiment nor the present invention is so limited. Rather, the instant embodiment and the present invention may alternatively be practiced using a semiconductor-on-insulator substrate. Such a semiconductor-on-insulator substrate would result under circumstances where a base semiconductor substrate 20a portion of the semiconductor substrate 20 that is illustrated in FIG. 3 is separated from a surface semiconductor layer 20b portion of the semiconductor substrate 20 that is illustrated in FIG. 3 by an optional buried dielectric layer 19 that is illustrated in phantom in FIG. 3.

The buried dielectric layer 19 may comprise any of several dielectric materials. Non-limiting examples include oxides, nitrides and oxynitrides of silicon. Oxides, nitrides and oxynitrides of other elements are not excluded. Typically, the buried dielectric layer 19 comprises an oxide of the semiconductor substrate 20. Typically, the buried dielectric layer 19 has a thickness from about 200 to about 4000 angstroms.

Within the context of the foregoing particular semiconductor-on-insulator substrate, the base semiconductor substrate 20a and the surface semiconductor layer 20b portions of the semiconductor substrate 20 that is illustrated in FIG. 3 may include the same or different semiconductor materials with respect to semiconductor material composition, crystallographic orientation, dopant polarity and dopant concentration. Typically, the surface semiconductor layer 20b has a thickness from about 50 nm up to about 5 micrometers, with thicknesses of a few hundred nm typical.

The semiconductor-on-insulator substrate in accordance with the foregoing description may be fabricated using any of several methods. Non-limiting examples include layer transfer methods, layer lamination methods and separation by implantation of oxygen (SIMOX) methods.

As an additional alternative option in place of a bulk semiconductor substrate or a semiconductor-on-insulator semiconductor substrate, the embodiment also contemplates use of a hybrid orientation (HOT) substrate within the context of the semiconductor substrate 20 that is illustrated in FIG. 3. Hybrid orientation substrates in general comprise multiple crystallographic orientations within a single semiconductor substrate. Non-limiting methods for fabricating hybrid orientation substrates include layer transfer methods, layer lamination methods and selective epitaxial methods.

The gate dielectric 22 may comprise generally conventional dielectric materials such as oxides, nitrides and oxynitrides of silicon that have a dielectric constant from about 4 to about 20, measured in vacuum. Alternatively, the gate dielectric 22 may also comprise generally higher dielectric constant dielectric materials having a dielectric constant from about 20 to at least about 100, also measured in vacuum. Such higher dielectric constant dielectric materials may include, but are not limited to hafnium oxides, hafnium silicates, titanium oxides, barium-strontium-titantates (BSTs) and lead-zirconate-titanates (PZTs). The gate dielectric 22 material may be provided as a crystalline dielectric material or a non-crystalline dielectric material. Crystalline dielectric materials are generally preferred. The gate dielectric 22 may be formed using any of several methods that are appropriate to its material of composition. Included, but not limiting, are thermal or plasma oxidation or nitridation methods, chemical vapor deposition methods (including atomic layer chemical vapor deposition methods) and physical vapor deposition methods (including sputtering methods). Typically, the gate dielectric 22 comprises a thermal silicon oxide dielectric material that has a thickness from about 10 to about 70 angstroms.

The gate electrode 24 may comprise materials including, but not limited to certain metals, metal alloys, metal nitrides and metal silicides, as well as laminates thereof and composites thereof. The gate electrode 24 may also comprise doped polysilicon and polysilicon-germanium alloy materials (i.e., having a dopant concentration from about 1e18 to about 1e22 dopant atoms per cubic centimeter) and polycide materials (doped polysilicon/metal silicide stack materials). Similarly, the foregoing materials may also be formed using any of several methods. Non-limiting examples include salicide methods, chemical vapor deposition methods and physical vapor deposition methods, such as, but not limited to evaporative methods and sputtering methods. Typically, the gate electrode 24 comprises a doped polysilicon material that has a thickness from about 600 to about 2000 angstroms.

Although not specifically illustrated in FIG. 3, often a sidewall oxide layer is grown to passivate a surface of the semiconductor substrate 20 and multiple surfaces of the gate electrode 24 (i.e., when the latter is comprised in particular of a polysilicon material). This sidewall oxide layer is typically from about 15 to about 100 angstroms in thickness, and it is grown on all silicon surfaces, including the substrate, a "bird's beak" region underneath the gate electrode edge, and all other available gate electrode surfaces.

The extension regions 30 are formed into the semiconductor substrate 20 while using an otherwise generally conventional ion implantation method. The ion implantation method uses the gate electrode 24 and the gate dielectric 22 as a mask, along with a dopant of appropriate polarity for a field effect transistor desired to be fabricated incident to further processing of the semiconductor structure of FIG. 3. Typically, the extension regions 30 are ion implanted to include an appropriate dopant, at a concentration from about $1 \times 10^{19}$ to about $1 \times 10^{21}$ dopant atoms per cubic centimeter. Other purposes of such an implant might be to passivate a surface. Under such circumstances, the dopant concentration will typically be in a range from about $10^{18}$ cm$^{-3}$ to about $10^{19}$ cm$^{-3}$.

Figure 4:
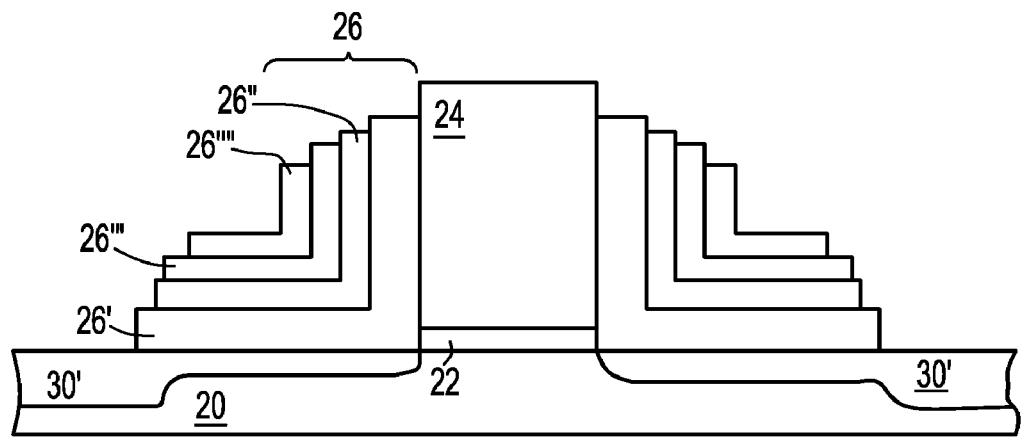

FIG. 4 shows the results of further processing of the semiconductor structure of FIG. 3.

FIG. 4 first shows the results of forming a multilayer spacer 26 adjacent and adjoining a sidewall of the gate electrode 24 and the gate dielectric 22, and partially covering the extension regions 30. The multilayer spacer 26 comprises: (1) two deposited (i.e., not thermally grown) silicon oxide spacer sub-layers 26' and 26''' (where the silicon oxide containing spacer sub-layer 26' is located contacting the gate electrode 24 and the gate dielectric 22, or the gate sidewall oxide if one was grown); and (2) two spacer sub-layers 26'' and 26'''' that comprise a material that is other than the deposited silicon oxide material (which are nested or interposed between the silicon oxide spacer sub-layers 26' and 26'').

Each of the spacer sub-layers 26', 26'', 26''' and 26'''' may be formed using methods that are conventional in the semiconductor fabrication art. Non-limiting examples include thermal or plasma oxidation or nitridation methods, chemical vapor deposition methods (including atomic layer chemical vapor deposition methods) and physical vapor deposition methods (including sputtering methods). Chemical vapor deposition methods are particularly common. However, in particular (and as noted above) thermal oxidation methods for forming the silicon oxide spacer sub-layers 26' and 26''' are not used. Each of the spacer sub-layers 26', 26'', 26''' and 26'''' preferably has a thickness and materials composition corresponding with the spacer sub-layers 14', 14'', 14''' and 14'''' that are illustrated in FIG. 1.

The spacer sub-layers 26', 26'', 26''' and 26'''' may be formed sequentially using an appropriate spacer sub-layer material deposition and sequential anisotropic etchback method. Alternatively, the spacer sub-layers 26', 26'', 26''' and 26'''' may be formed using a sequential deposition of blanket spacer sub-layer material layers followed by a single anisotropic etchback method.

FIG. 4 also shows the results of ion implanting the semiconductor substrate 20 while using the gate electrode 24 and the multilayer spacer 26 as a mask, to form source/drain contact regions which incorporate the extension regions 30 and thus provide source/drain regions 30'. The source/drain contact regions are formed using methods that are analogous to the methods that are used for forming the extension regions 30 that are illustrated in FIG. 3. Typically the source/drain contact regions are formed using an ion implant method that is analogous or equivalent to the ion implant method that is used for forming the extension regions 30. Typically, the ion implant method uses an appropriate dopant that is implanted to provide the contact region portions of the source/drain regions 30' having a dopant concentration from about $10^{20}$ cm-3 to about $10^{22}$ cm$^{-3}$ dopant atoms per cubic centimeter. Again, other applications for such an ion implant could include surface passivating applications, in which case an implant concentration might be from about $10^{18}$ cm$^{-3}$ to about $10^{19}$ cm$^{-3}$.

Subsequent to the ion implantation that is illustrated within the schematic cross-sectional diagram of FIG. 4 to form the source/drain regions 30', the semiconductor structure of FIG. 4 may be thermally annealed at a temperature from about 900 to about 1150 degrees centigrade for a time period from about 2 minutes to essentially no time (i.e., a "spike anneal") to fully activate the implanted dopant atoms that comprise the source/drain regions 30'. Typical activation conditions might be about 1000 degrees centigrade for about 5 seconds. A similar annealing and activation sequence might also be used with respect to the extension region 30 that are illustrated in FIG. 3.

Figure 5:
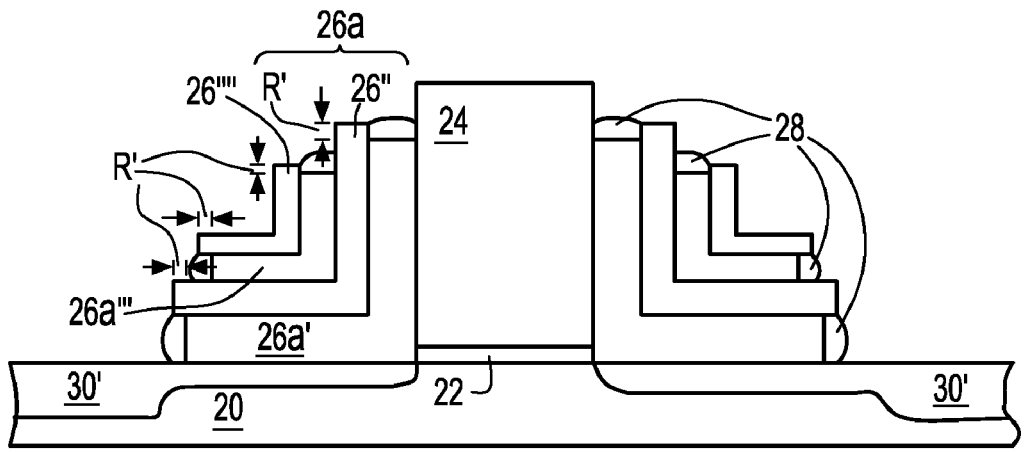

FIG. 5 shows a schematic cross-sectional diagram that illustrates the results of etching the semiconductor structure of FIG. 4 while using a chemical oxide removal (COR) etchant. Within the context of the embodiment and the invention, a chemical oxide removal (COR) etchant is intended as an etchant that etches dense thermally grown silicon oxide materials at a faster rate than less dense deposited silicon oxide materials. The dense thermally grown silicon oxide materials will typically form upon exposed surfaces of a gate electrode (such as the gate electrode 24) and a semiconductor substrate (such as the semiconductor substrate 20) incident to thermal processing of the semiconductor structure of FIG. 4. Such thermal processing may result from forming the spacer sub-layers 26', 26'', 26''' and 26''' within the multilayer spacer 26. Alternatively, such thermal processing may be intended to activate dopants within the source/drain regions 30'.

A chemical oxide removal (COR) etchant in accordance with the invention comprises an anhydrous gaseous mixture of ammonia (i.e., NH3) and hydrogen fluoride (i.e., HF). The semiconductor structure of FIG. 4 is treated with the gaseous mixture of ammonia and hydrogen fluoride using: (1) a temperature at about room temperature (i.e. from about 20 to about 30 degrees C.); (2) a reactor chamber pressure from about 4 mTorr to about 1 torr with preferred conditions from about 4 to about 15 mTorr; and (3) an ammonia flow rate from about 5 to about 50 standard cubic centimeters per minute and a hydrogen fluoride flow rate from about 2 to about 25 standard cubic centimeters per minute. The chemical oxide removal (COR) etchant provides the inhibited etch rate of the deposited silicon oxide spacer sub-layers 26' and 26''' in comparison with a thermally grown silicon oxide material by virtue of formation of the passivating residue layers 28 that are illustrated in FIG. 5. The passivating residue layers 28 comprise etch byproducts of the chemical oxide removal (COR) etchant that are larger in size than the deposited silicon oxide material that is etched. Thus, within crevices the passivating residue layer 28 etch byproducts rapidly limit the chemical oxide removal (COR) etch reaction. The chemical oxide removal (COR) etch therefore stops more quickly in a crevice than it would on an equivalent thickness planar film. The foregoing proposed mechanism limits the undercut of the spacer sub-layers 26a' and 26a'''.

The passivating residue layers 28 comprise a diammoniumhexafluorosilicate (i.e., (NH4)2SiF6) material that effectively passivates exposed surfaces of the silicon oxide spacer sub-layers 26a' and 26a''' after having etched a thickness therefrom of about 50 to about 150 angstroms. Removal of the thickness from about 50 to about 150 angstroms from exposed top and end portions of the silicon oxide spacer sub-layers 26' and 26''' provides that the silicon oxide spacer sub-layers 26a' and 26a''' are in fact recessed beneath the other than silicon oxide spacer sub-layers 26'' and 26'''', but only by a recess R' distance from about 50 to about 150 angstroms (and no greater than about 150 angstroms). This recess R' distance is considerably less than the recess R distance that is realized using a dilute hydrofluoric acid etchant that is illustrated in FIG. 2. Thus, within the embodiment that is illustrated within the schematic cross-sectional diagram of FIG. 5, the spacer sub-layers 26'' and 26'''' are less likely to delaminate from the etched and recessed silicon oxide spacer sub-layers 26a' and 26a'''.

Prior to the chemical oxide removal (COR) etchant that is described above, the embodiment also contemplates use of a dilute hydrofluoric acid/ethylene glycol etchant having a volume ratio of 49 percent aqueous HF:ethylene glycol from about 9:90 to about 11:90. The foregoing dilute hydrofluoric acid/ethylene glycol etchant is used at a temperature from about 81 to about 83 degrees centigrade to provide a removal equivalent to about 12 to about 16 angstroms of a thermal silicon oxide material. The foregoing dilute hydrofluoric acid/ethylene glycol etchant is useful is assuring absence of polysilicon stringers prior to further processing of the semiconductor structure that is illustrated in FIG. 4

Figure 6:
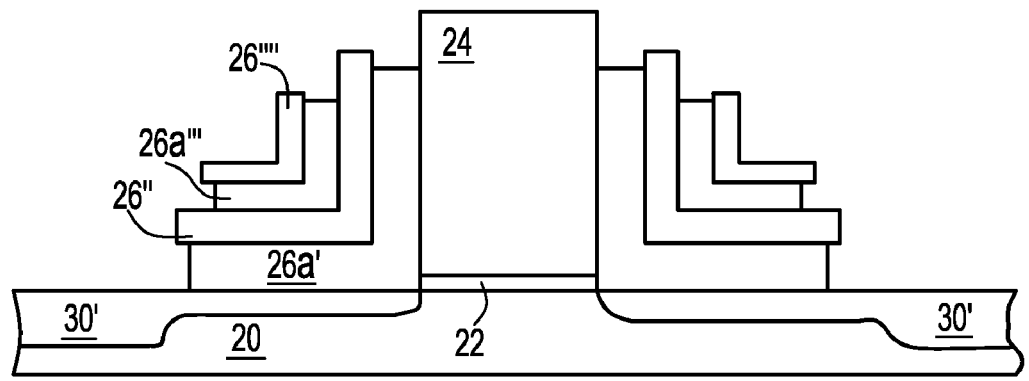

FIG. 6 shows the results of further processing of the semiconductor structure of FIG. 5.

FIG. 6 shows the results of removing the residue layers 28 from the etched and recessed silicon oxide spacer sub-layers 26a' and 26a'''. The residue layers 28 may be removed using methods that are conventional in the semiconductor fabrication art. Non-limiting examples include thermal desorption methods that use a thermal desorption temperature above about 100 degrees C. (i.e., with preferred conditions of about 110 degrees C.) for a time period of longer than about 15 seconds. Also applicable, and also not limiting, are solvent stripping methods that may use aqueous solutions, including in particular deionized water.

As an adjunct or an alternative to the semiconductor processing that is described above within the context of FIG. 6, the invention also contemplates use of a buffered hydrofluoric acid etchant having a volume ratio of 8:5:1 DI H2O: ammonium fluoride:49 percent aqueous HF. The foregoing buffered hydrofluoric acid etchant is used at a temperature from about 20 to about 22 degrees centigrade to provide a removal equivalent to about 29 to about 30 angstroms of a thermal silicon oxide material. Such a buffered hydrofluoric acid etchant is intended for removal of residues, such as nitride residues, photoresist residues and metal residues, that are not typically removed by a chemical oxide removal (COR) etchant. Such a chemical oxide removal (COR) etchant is typically specific to silicon oxide etching.

In accordance with the foregoing, the embodiment thus preferably comprises: (1) an aqueous hydrofluoric acid/ethylene glycol etchant; followed by (2) a chemical oxide removal (COR) etchant; followed by (3) a buffered hydrofluoric acid etchant, for forming the semiconductor structure of FIG. 6 from the semiconductor structure of FIG. 4.

Figure 7:
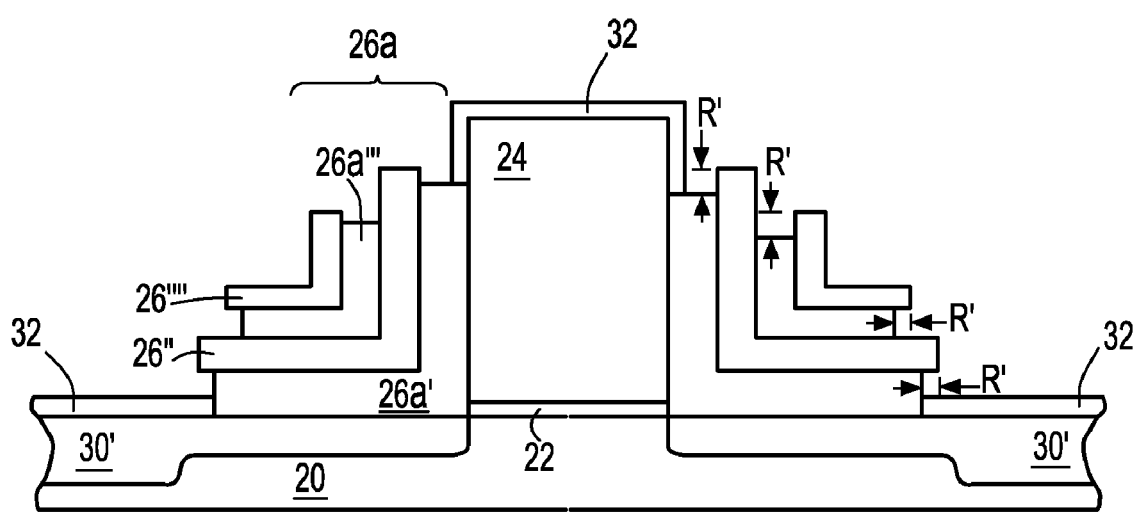

FIG. 7 shows the results of further processing of the semiconductor structure of FIG. 6.

FIG. 7 shows a plurality of silicide layers 32 located upon the source/drain regions 30' and the gate electrode 24.

The silicide layers 32 may comprise any of several metal silicide forming metals that are conventional in the semiconductor fabrication art. Non-limiting examples of metal silicide forming metals include nickel, cobalt, platinum, titanium, tungsten, tantalum and vanadium metal silicide forming metals. Nickel silicides and cobalt silicides are particularly common silicides from which may be comprised the silicide layers 32. Although other methods are not excluded, the silicide layers 32 are typically formed using a salicide method. Such a salicide method uses a blanket deposition of a metal silicide forming metal layer, followed by a thermal annealing to provide a metal silicide at locations where the metal silicide forming metal layer contacts a silicon surface. Unreacted portions of metal silicide forming metal layers are then stripped to leave remaining the silicide layers 32. The stripping of the unreacted portions of the metal silicide forming metal layers is typically effected using a stripping method and material that is otherwise appropriately selected for a particular metal silicide forming metal.

FIG. 7 shows a schematic cross-sectional diagram of a semiconductor structure in accordance with an embodiment of the invention. This particular embodiment comprises a preferred embodiment of the invention. The semiconductor structure includes a field effect transistor that in turn includes a multilayer spacer 26a adjacent and adjoining a sidewall of a gate electrode 24 within the field effect transistor. The multilayer spacer 26a comprises spacer sub-layers 26a' and 26a''' that comprise a deposited (i.e., not thermally grown) silicon oxide material, and of which silicon oxide spacer sub-layer 26a' is located adjacent and adjoining the gate electrode 24. The multilayer spacer 26a also comprises spacer sub-layers 26" and 26"" that comprise a material that is other than the deposited silicon oxide material from which is comprised the spacer sub-layers 26a' and 26a'''. The spacer sub-layers 26" and 26"" are located interposed between or laminated to the spacer sub-layers 26a' and 26a'''. The spacer sub-layers 26a' and 26a''' are recessed beneath the spacer sub-layers 26" and 26"" by a recess R' distance of no greater than the thickness of the spacer sub-layers 26a' and 26a''', or about 150 angstroms, and more preferably from about 50 to about 150 angstroms.

Such a limited recess R' distance is realized within the context of the embodiment by using a chemical oxide removal (COR) etchant when cleaning and treating the semiconductor structure that is illustrated in FIG. 4 prior to forming thereupon the silicide layers 32 that are illustrated in FIG. 7. The chemical oxide removal (COR) etchant provides the foregoing limited recess R' distance insofar as the chemical oxide removal (COR) etchant (comprising gaseous ammonia and hydrogen fluoride) provides a self-inhibiting passivation layer comprising a diammoniumhexafluorosilicate (or related) material when etching a deposited silicon oxide material from which is comprised the silicon oxide spacer sub-layers 26a' and 26a'''in comparison with a thermal silicon oxide material. In a crevice, this self-inhibiting passivation layer will rapidly inhibit lateral etching of spacer sub-layers 26a' and 26a'''.

The foregoing preferred embodiment of the invention is illustrative of the invention rather than limiting of the invention. Revisions and modifications may be made to methods, materials, structures and dimensions of a semiconductor structure in accordance with the embodiment that is illustrated in FIG. 7, while still providing a semiconductor structure in accordance with the invention, further in accordance with the accompanying claims.

What is claimed is:

1. A method for fabricating a semiconductor structure comprising:
    forming a topographic feature over a substrate;
    forming a multilayer spacer adjoining a sidewall of the topographic feature, the multilayer spacer comprising a first spacer sub-layer comprising a deposited silicon oxide material laminated to a second spacer sub-layer comprising a material that is other than the deposited silicon oxide material; and
    treating the multilayer spacer with a chemical oxide removal (COR) etchant to recess the first spacer sub-layer with respect to the second spacer sub-layer, where the chemical oxide removal etchant comprises a gaseous mixture of ammonia and hydrogen fluoride that provides an etch limiting residue within a recess of the first spacer sub-layer with respect to the second spacer sub-layer.

2. The method of claim 1 wherein the recess has a recess distance no greater than a thickness of the first spacer sub-layer.

3. The method of claim 1 wherein the forming the topographic feature uses a material selected from the group consisting of conductor materials, semiconductor materials and dielectric materials.

4. The method of claim 1 wherein the forming the multilayer spacer uses the first spacer sub-layer located adjoining the topographic feature and the second spacer sub-layer located adjoining the first spacer sub-layer.

5. The method of claim 1 further comprising treating the semiconductor structure with a hydrofluoric acid/ethylene glycol etchant prior to treating the semiconductor structure with the chemical oxide removal (COR) etchant.

6. The method of claim 1 further comprising treating the semiconductor structure with a buffered hydrofluoric acid etchant subsequent to treating the semiconductor structure with the chemical oxide removal (COR) etchant.

7. A method for fabricating a semiconductor structure comprising:

forming a gate electrode over a semiconductor substrate;

forming a multilayer spacer adjoining a sidewall of the gate electrode, the multilayer spacer comprising a first spacer sub-layer comprising a deposited silicon oxide material laminated to a second spacer sub-layer comprising a material that is other than the deposited silicon oxide material; and treating the semiconductor substrate and the multilayer spacer with a chemical oxide removal (COR) etchant to recess the first spacer sub-layer with respect to the second spacer sub-layer, wherein the chemical oxide removal etchant comprises a gaseous mixture of ammonia and hydrogen fluoride that provides an etch limiting residue within a recess of the first spacer sub-layer with respect to the second spacer sub-layer.

8. The method of claim 7 further comprising forming a plurality of silicide layers upon exposed portions of the gate electrode and the semiconductor substrate.

9. The method of claim 1 wherein the recess has a recess distance less than a thickness of the first spacer sub-layer.

10. The method of claim 1 further comprising thermally desorbing the etch limiting residue.

11. The method of claim 7 further comprising thermally desorbing the etch limiting residue.

12. The method of claim 1 wherein the gaseous mixture of ammonia and hydrogen fluoride is anhydrous.

13. The method of claim 7 wherein the gaseous mixture of ammonia and hydrogen fluoride is anhydrous.

* * * * *